(12) United States Patent
Ghoshal et al.

(10) Patent No.: US 11,713,908 B2
(45) Date of Patent: Aug. 1, 2023

(54) ECO-FRIENDLY TEMPERATURE SYSTEM

(71) Applicant: Sheetak, Inc., Austin, TX (US)

(72) Inventors: Uttam Ghoshal, Austin, TX (US); Key Kolle, Luling, TX (US)

(73) Assignee: Sheetak, Inc., Austin, TX (US)

( * ) Notice: Subject to any disclaimer, the term of this patent is extended or adjusted under 35 U.S.C. 154(b) by 323 days.

(21) Appl. No.: 16/649,496

(22) PCT Filed: Oct. 24, 2018

(86) PCT No.: PCT/US2018/057400
§ 371 (c)(1),
(2) Date: Mar. 20, 2020

(87) PCT Pub. No.: WO2019/084199
PCT Pub. Date: May 2, 2019

(65) Prior Publication Data
US 2020/0248934 A1    Aug. 6, 2020

Related U.S. Application Data

(60) Provisional application No. 62/576,501, filed on Oct. 24, 2017.

(51) Int. Cl.
| | |
|---|---|
| *F25B 21/02* | (2006.01) |
| *H10N 10/852* | (2023.01) |
| *H10N 10/853* | (2023.01) |
| *H10N 10/855* | (2023.01) |
| *H10N 19/00* | (2023.01) |
| *F25B 21/04* | (2006.01) |

(52) U.S. Cl.
CPC ......... *F25B 21/02* (2013.01); *H10N 10/852* (2023.02); *H10N 10/853* (2023.02); *H10N 10/855* (2023.02); *H10N 19/101* (2023.02); *F25B 21/04* (2013.01); *F25B 2321/023* (2013.01); *F25B 2321/0251* (2013.01)

(58) Field of Classification Search
None
See application file for complete search history.

(56) References Cited

U.S. PATENT DOCUMENTS

| | | | |
|---|---|---|---|
| 3,296,034 A | 1/1967 | Borg | |
| 9,596,944 B2 | 3/2017 | Makansi et al. | |
| 9,842,979 B2 * | 12/2017 | Himmer | H01L 35/30 |
| 10,032,975 B2 | 7/2018 | Ghoshal | |

(Continued)

FOREIGN PATENT DOCUMENTS

EP    2230701 A2 *  9/2010  ......... F28D 21/0003

OTHER PUBLICATIONS

English machine translation of Himmer (EP-2230701-A2) provided by the EPO website, All Pages, 2022. (Year: 2022).*

(Continued)

*Primary Examiner* — Daniel P Malley, Jr.
(74) *Attorney, Agent, or Firm* — Clark Hill, PLC

(57) ABSTRACT

The present disclosure is related to thermoelectric panels and their use in cooling and heating systems. The cooling/heating systems may include a plurality of thermoelectric panels. The panels may include thermoelectric devices embedded between a housing formed by heat conductive layers and edge structures for preserve a low thermal conductivity volume.

21 Claims, 11 Drawing Sheets

(56) References Cited

U.S. PATENT DOCUMENTS

| | | | |
|---|---|---|---|
| 2005/0045702 A1* | 3/2005 | Freeman | H01L 35/30 228/180.21 |
| 2010/0257871 A1* | 10/2010 | Venkatasubramanian | H01L 35/325 62/3.7 |
| 2012/0049315 A1* | 3/2012 | Kim | H01L 35/34 438/54 |
| 2014/0305483 A1* | 10/2014 | Huang | H01L 35/34 438/54 |
| 2015/0128614 A1* | 5/2015 | Ghoshal | F25B 21/00 62/3.3 |
| 2015/0155413 A1 | 6/2015 | Ghoshal et al. | |
| 2015/0159924 A1 | 6/2015 | Calderon et al. | |
| 2015/0280097 A1 | 10/2015 | Jinushi et al. | |
| 2015/0325773 A1 | 11/2015 | Ghoshal | |
| 2016/0178252 A1 | 6/2016 | Nakamura et al. | |
| 2016/0372650 A1 | 12/2016 | Ghoshal et al. | |
| 2017/0219256 A1 | 8/2017 | Friend et al. | |
| 2018/0337321 A1 | 11/2018 | Ghoshal | |
| 2018/0366629 A1 | 12/2018 | Ghoshal et al. | |

OTHER PUBLICATIONS

PCT International Search Report for International Application No. PCT/US18/57400 dated Jan. 11, 2019 (2 pages).
PCT Written Opinion of the International Searching Authority for International Application No. PCT/US18/57400 dated Jan. 11, 2019 (6 pages).
Examination Report for India App. No. 202017034922 dated May 9, 2022.

\* cited by examiner

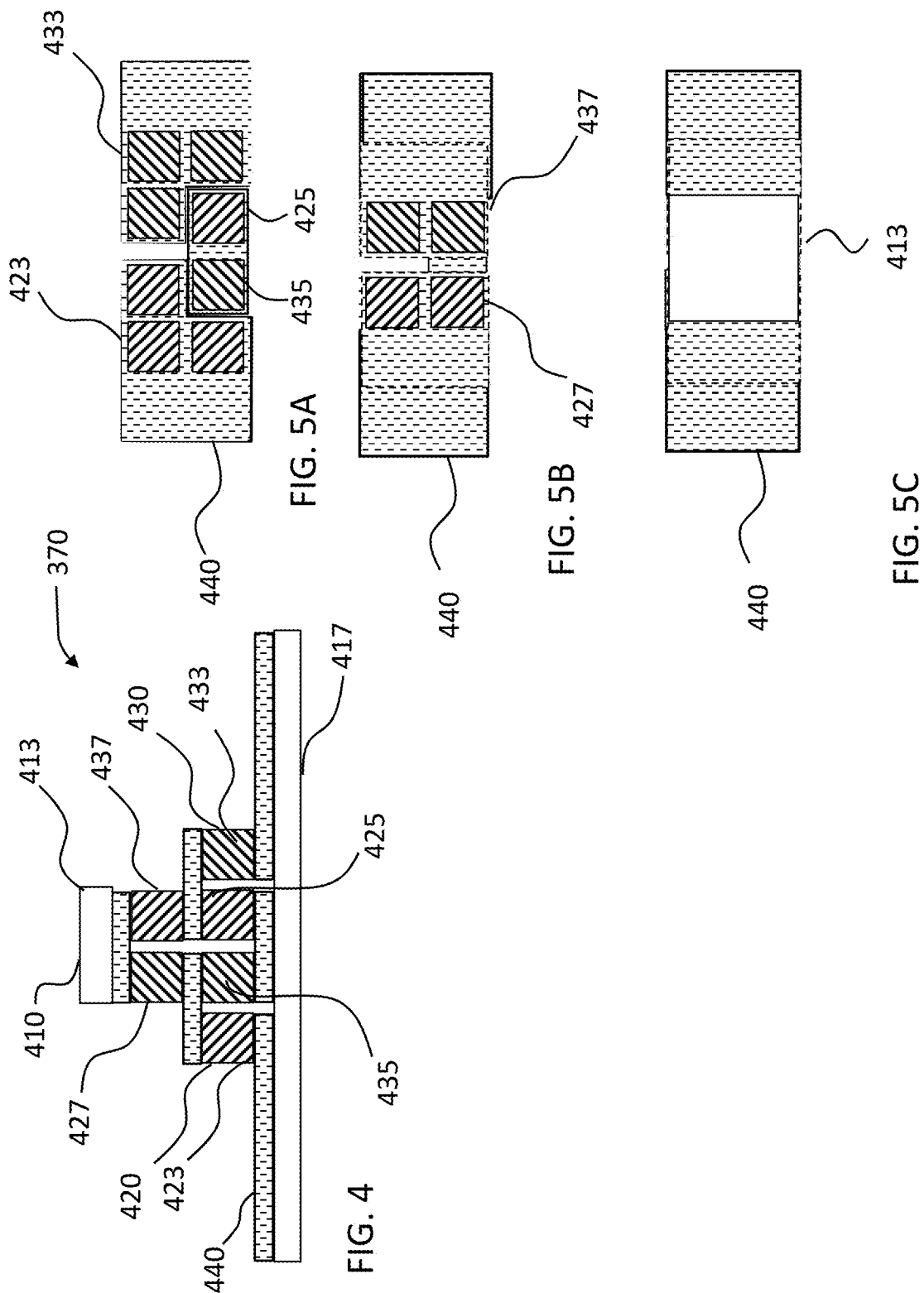

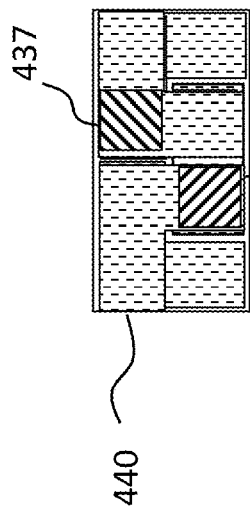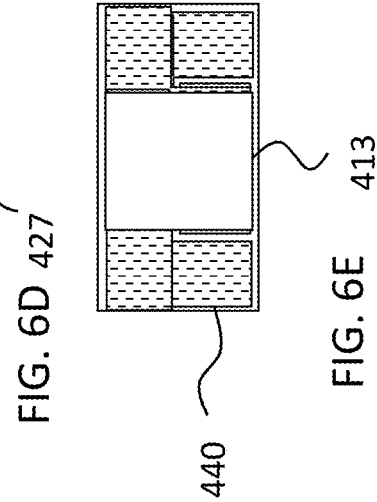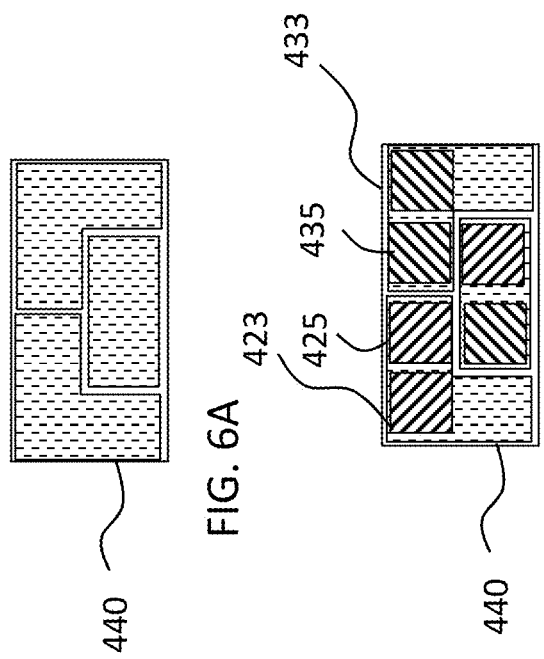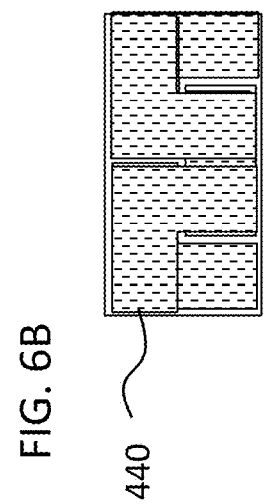

ECO-FRIENDLY TEMPERATURE SYSTEM

BACKGROUND OF THE DISCLOSURE

1. Field of the Disclosure

The present disclosure relates to apparatuses and methods for refrigeration, and, in particular, refrigeration involving thermoelectric devices.

2. Description of the Related Art

Refrigeration technologies have been around for centuries, from use of running water and evaporation to the ice box and the motorized, compressor-based refrigeration systems. Thermoelectric devices have been used since the 1900s to heat, cool, and generate power; however, widespread use has been held back due to poor performance and low efficiency when compared with other available heating, cooling, and power generation technologies.

A shortcoming in prior art refrigeration systems is the use of greenhouse gases for the compression-expansion cycle. Another shortcoming in prior art refrigeration systems is the use of moving parts that are subject to wear, breakage, noise product. Another shortcoming in prior art refrigeration systems is the size and mass of the compressor and associated parts, which greatly reduce the ease of portability and placement of the refrigeration system. Another shortcoming in prior art refrigeration is the difficulty of interfacing renewable energy sources, such as solar panels and wind turbines, to the compressor-based refrigeration systems. Another shortcoming in prior art refrigeration is the difficulty in providing fault-tolerant, distributed multiple compressors systems.

What is needed is a refrigeration system that does not require greenhouse gases as a refrigerant, uses non-moving parts to provide cooling, and is lightweight and easily transportable. In addition, a refrigeration system is needed that can be powered by non-power grid alternative power sources, such as solar panels, and exhibits fault-tolerant redundancy.

BRIEF SUMMARY OF THE DISCLOSURE

In aspects, the present disclosure is related to an apparatus and method for using refrigeration systems, and, in particular, using thermoelectric devices to provide refrigeration.

One embodiment according to the present disclosure includes a thermoelectric apparatus, the apparatus including a plurality of thermoelectric panels, each of the thermoelectric panels including a first layer having an inner side and an outer side, wherein the first layer thermally conductive; a plurality of thermoelectric devices disposed on the inner side of the first layer; a second layer having an inner side and an outer side, wherein the second layer thermally conductive, and wherein the plurality of thermoelectric devices are disposed on the inner side of the second layer; a plurality of edge structures connected to the first layer and the second layer to form a volume between the first layer, the second layer, and the plurality of edge structures, wherein each of the edge structures includes a u-shaped housing; a gas diffusion resistant layer disposed on the u-shaped housing; and a plurality of pillars disposed within the u-shaped housing between parallel sides of the u-shaped housing; an insulated bottom supporting the plurality of thermoelectric panels; and an insulated top supported by the plurality of thermoelectric panels.

Each of the thermoelectric devices may include a first substrate layer; a first set of metal links disposed on one side of the first substrate layer; a first stage of thermoelements disposed on and in electrical and thermal communication with the first set of metal links and including a first plurality of n-type thermoelements; and a first plurality of p-type thermoelements alternating with the first plurality of n-type thermoelements; a second stage of thermoelements disposed on and in electrical and thermal communication with the first stage of thermoelements and including a second plurality of n-type thermoelements; and a second plurality of p-type thermoelements alternating with the second plurality of n-type thermoelements; a second set of metal links disposed on and in electrical and thermal communication with the second stage of thermoelements; and a second substrate layer disposed on the second set of metal links.

The apparatus may have a front end and a back end and the first stage thermoelement closest to the front end may be the same type as the second stage thermoelement closest to the front end. The first stage thermoelement closest to the back end may be the same type as the second stage thermoelement closest to the back end. The thermoelements of the second stage may have greater electrical resistances than the thermoelements of the first stage.

The n-type thermoelements may include an n-type thermoelectric material comprising at least one of: alloys of Bismuth Telluride and Bismuth Selenide, Bi2Te2.7Se0.3, P-doped SiGe, YbAl3, P-doped Si, SiGe nanowires, rare earth tellurides, La3Te4, Pr3Te4, skutterudites, Ba—Yb—CoSb3, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material comprising at least one of: alloys of bismuth telluride and antimony telluride, Bi0.5Sb1.5Te3, B-doped SiGe, B-doped Si, SiGe nanowires, Zn4Sb3, skutterudites, CeFe3.5Co0.5Sb12, Zintl compounds, Yb14MnSb11, rare earth tellurides, Ce3Te4, MnSi1.73, SnSe, PbSbAgSnTe, CePd3, NaCo2O4, half-Heusler alloys, and Nb—Ti—Fe—Sb—Sn. The n-type thermoelements may include Bi2-xSbxTe3 and the p-type thermoelements may include Bi2Te3-ySey, where x is between about 1.4 and 1.6 and y is between about 0.1 and 0.3.

The substrate layer may include one of: a ceramic, an insulator and metal combination, and an insulator and semiconductor combination, where the ceramic may include at least one of: alumina Al2O3, aluminum nitride (AlN), berylium oxide (BeO), boron nitride (BN), diamond (C), silicon nitride (SiN), and sapphire (SiC) or, in the insulator and metal combination, the insulator may include at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite, or, in the insulator and semiconductor combination, the insulator may include at least one of: thermal silicon oxide, CVD silicon oxide, and silicon nitride (SiN); and the semiconductor comprises one of: silicon and silicon carbide (SiC). The insulator may be equal to or less than about 10 micrometers thick.

The metal links may be made of at least one of: 1) copper, 2) copper with a coating of nickel, gold, platinum/gold alloy, or silver, 3) nickel with a coating of gold, platinum/gold alloy, or silver. Each of the n-type and p-type thermoelements may include: a pair of metal layers; a pair of coating layers disposed between the metal layers; and one of an n-type and p-type thermoelectric material disposed between the pair of coating layers. The coating layers comprise at least one of: titanium tungsten (TiW), tantalum nitride (TaN), tantalum (Ta), and nickel (Ni).

In some embodiments, each of the thermoelectric devices may further include at least one thermally conductive spacer disposed between the thermoelectric unit and the inner face of at least one of the first inner layer and the second layer. There may be a thermal interface layer disposed between the at least one thermally conductive spacer and the inner face. The apparatus may include a plurality of cooling structures disposed on the outer side of the first layer. The apparatus may include a plurality of cooling structures disposed on the outer side of the second layer. The apparatus may include an air mover positioned to direct air flow over the surface of at least one of the plurality of thermoelectric panels. The first layer and the second layer may be impervious to the diffusion of gases.

Another embodiment according to the present disclosure includes a thermoelectric apparatus that includes a plurality of thermoelectric panels, each of the thermoelectric panels comprising: a first layer having an inner side and an outer side, wherein the first layer prevents diffusion of gasses and is thermally conductive; a plurality of thermoelectric devices disposed on the inner side of the first layer, each of the thermoelectric devices comprising: a two-stage thermoelectric unit; a thermally conductive spacer; and a thermal interface layer; a second layer having an inner side and an outer side, wherein the second layer is air-tight and prevents diffusion of gasses and is thermally conductive, and wherein the plurality of thermoelectric devices are disposed on the inner side of the second layer; a plurality of edge structures connected to the first layer and the second layer to form a volume between the first layer, the second layer, and the plurality of edge structures, wherein each of the edge structures comprises: a u-shaped housing; an gas diffusion resistant layer disposed on the u-shaped housing; and a plurality of pillars disposed within the u-shaped housing between parallel sides of the u-shape; and a plurality of cooling structures disposed on the outer side of the first layer; an insulated bottom supporting the plurality of thermoelectric panels; an insulated top supported by the plurality of thermoelectric panels; and an air mover positioned to direct air flow over the surface of at least one of the thermoelectric panels.

Another embodiment according to the present disclosure includes a thermoelectric panel, the panel comprising: a first layer having an inner side and an outer side, wherein the first layer is thermally conductive; a plurality of thermoelectric devices disposed on the inner side of the first layer; a second layer having an inner side and an outer side, wherein the second layer is thermally conductive, and wherein the plurality of thermoelectric devices are disposed on the inner side of the second layer; and a plurality of edge structures connected to the first layer and the second layer to form a volume between the first layer, the second layer, and the plurality of edge structures, wherein each of the edge structures comprises: a u-shaped housing; a gas diffusion resistant layer disposed on the u-shaped housing; and a plurality of pillars disposed within the u-shaped housing between parallel sides of the u-shaped housing.

Each of the thermoelectric devices may also include at least one thermally conductive spacer disposed between the thermoelectric unit and the inner face of at least one of the first inner layer and the second layer. A thermal interface layer may be disposed between the at least one thermally conductive spacer and the inner face. The thermoelectric apparatus may also include a plurality of cooling structures disposed on the outer side of the first layer. The thermoelectric apparatus may also include a plurality of cooling structures disposed on the outer side of the second layer. The first layer and the second layer may be gas diffusion resistant.

Another embodiment according to the present disclosure includes a thermoelectric panel. The thermoelectric panel may include a curved surface formed by a first layer having an inner side and an outer side, wherein the first layer prevents diffusion of gasses and is thermally conductive; a plurality of thermoelectric devices disposed on the inner side of the first layer, each of the thermoelectric devices comprising: a thermoelectric unit; and a second layer having an inner side and an outer side, wherein the second layer prevents diffusion of gasses and is thermally conductive, the plurality of thermoelectric devices are disposed on the inner side of the second layer, and the second layer is curved to maintain a fixed distance between the first layer and the second layer. The panel may also include a plurality of edge structures connected to the first layer and the second layer to form a volume between the first layer, the second layer, and the plurality of edge structures, wherein each of the edge structures comprises: a u-shaped housing; a gas diffusion resistant layer disposed on the u-shaped housing; and a plurality of pillars disposed within the u-shaped housing between parallel sides of the u-shaped housing. The thermoelectric unit may include a first substrate layer; a first set of metal links disposed on one side of the first substrate layer; a first stage of thermoelements disposed on and in electrical and thermal communication with the first set of metal links and comprising: a first plurality of n-type thermoelements; and a first plurality of p-type thermoelements alternating with the first plurality of n-type thermoelements; a second stage of thermoelements disposed on and in electrical and thermal communication with the first stage of thermoelements and comprising: a second plurality of n-type thermoelements; and a second plurality of p-type thermoelements alternating with the second plurality of n-type thermoelements; a second set of metal links disposed on and in electrical and thermal communication with the second stage of thermoelements; and a second substrate layer disposed on the second set of metal links. Each of the thermoelectric devices may also include at least one thermally conductive spacer disposed between the thermoelectric unit and the inner face of at least one of the first inner layer and the second layer. A thermal interface layer may be disposed between the at least one thermally conductive spacer and the inner face. The panel may include a plurality of cooling structures disposed on the outer side of the first layer. The panel may also include a plurality of cooling structures disposed on the outer side of the second layer.

Another embodiment according to the present disclosure includes a method of cooling using a thermoelectric apparatus, the apparatus comprising: a plurality of thermoelectric panels, each of the thermoelectric panels comprising: a first layer having an inner side and an outer side, wherein the first layer prevents diffusion of gasses and is thermally conductive; a plurality of thermoelectric devices disposed on the inner side of the first layer, each of the thermoelectric devices comprising: a thermoelectric unit; a second layer having an inner side and an outer side, wherein the second layer prevents diffusion of gasses and is thermally conductive, and wherein the plurality of thermoelectric devices are disposed on the inner side of the second layer; a plurality of edge structures connected to the first layer and the second layer to form a volume between the first layer, the second layer, and the plurality of edge structures, wherein each of the edge structures comprises: a u-shaped housing; a gas diffusion resistant layer disposed on the u-shaped housing; and a plurality of pillars disposed within the u-shaped housing between parallel sides of the u-shaped housing; an insulated bottom supporting the plurality of thermoelectric panels; and an insulated top supported by the plurality of thermoelectric panels; the method comprising: removing heat from the apparatus by applying electrical energy to at least one thermoelectric panel. Where the thermoelectric apparatus further comprises: a plurality of cooling structures disposed on the outer side of the first layer; and the method further comprises: moving air over the plurality of cooling structures to remove heat from the outer side of the first layer.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein:

FIG. 4 is a diagram of a two-stage thermoelectric converter according to one embodiment of the present disclosure;

FIG. 5A is a top view diagram of the first layer of a unit cell for the two-stage thermoelectric converter of FIG. 4;

FIG. 5B is a top view diagram of the second layer of a unit cell for the two-stage thermoelectric converter of FIG. 4;

FIG. 5C is a top view diagram of the third layer of a unit cell for the two-stage thermoelectric converter of FIG. 4;

FIG. 6A is a top view diagram of the first layer of a unit cell for another two-stage thermoelectric converter of FIG. 4;

FIG. 6B is a top view diagram of the second layer of a unit cell for another two-stage thermoelectric converter of FIG. 4;

FIG. 6C is a top view diagram of the third layer of a unit cell for another two-stage thermoelectric converter of FIG. 4;

FIG. 6D is a top view diagram of the fourth layer of a unit cell for another two-stage thermoelectric converter of FIG. 4;

FIG. 6E is a top view diagram of the fifth layer of a unit cell for another two-stage thermoelectric converter of FIG. 4;

DETAILED DESCRIPTION OF THE DISCLOSURE

Figure 1:
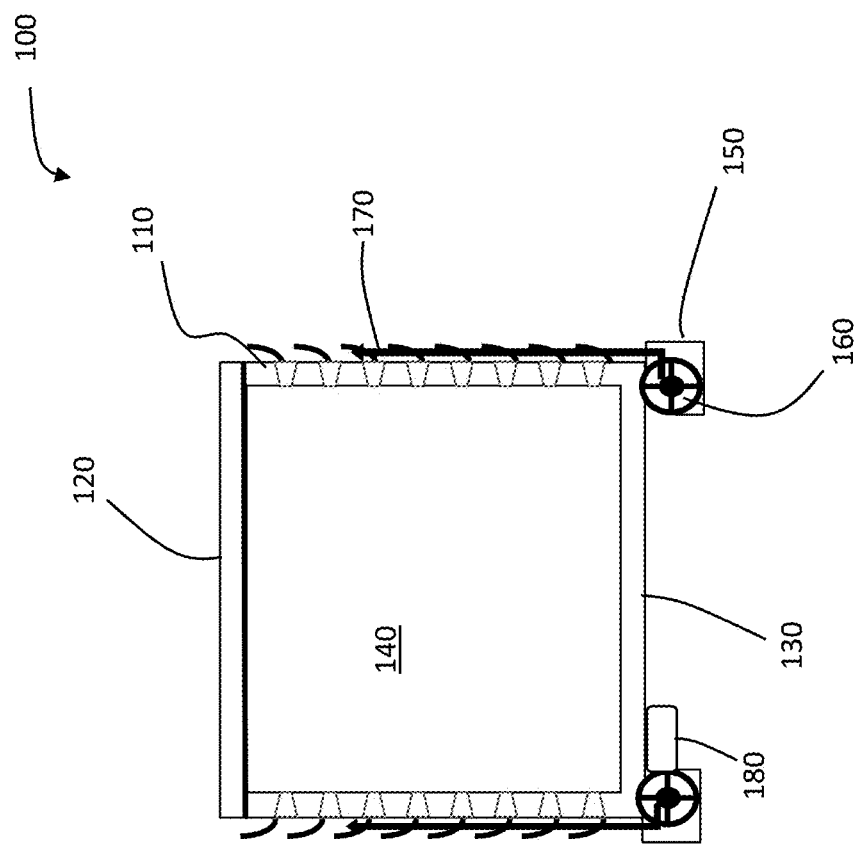
FIG. 1 is a two-dimensional diagram of a cooling apparatus with thermoelectric cooling panels according to one embodiment of the present disclosure.

Generally, the present disclosure relates to apparatuses and methods for a refrigeration system, and, in particular, using thermoelectric devices for refrigeration. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein.

FIG. 1 shows a refrigeration apparatus 100 according to one embodiment of the present disclosure. The apparatus 100 may include a plurality of thermoelectric panels 110. The apparatus 100 as shown is substantially cube shaped, with the thermoelectric panels 110 disposed vertically to make up the sides of a cube. An insulated top cover 120 and an insulated bottom layer 130 are attached to the panels 110 to complete the cube shape. The use of cube shape is illustrative and exemplary only, as the refrigeration apparatus 100 may be formed into other shapes, such as spheres, rectangular prisms, pyramids, etc. The apparatus 100 may include one or more power supplies 180 for one or more of the thermoelectric panels 110 as would be understood by a person of ordinary skill in the art. The one or more power supplies 180 may include any suitable power source, including, but not limited to, an alternating current source, a battery, and a solar panel.

The apparatus 100 has an interior 140, which may be maintained at a colder temperature than the ambient air as the heat is drawn out through the thermoelectric panels 110. The apparatus 100 may include one or more supports 150 that support the insulated bottom layer 130 and facilitate ambient air flow below the insulated bottom layer 130. The apparatus 100 may include an air mover 160, such as a fan or syn-jet, to direct a flow of air 170 across the outer surface of the thermoelectric panels 110 to enhance the cooling effect by removing heat. In some embodiments, the air mover 160 may be powered by the power supply 180.

Figure 2:
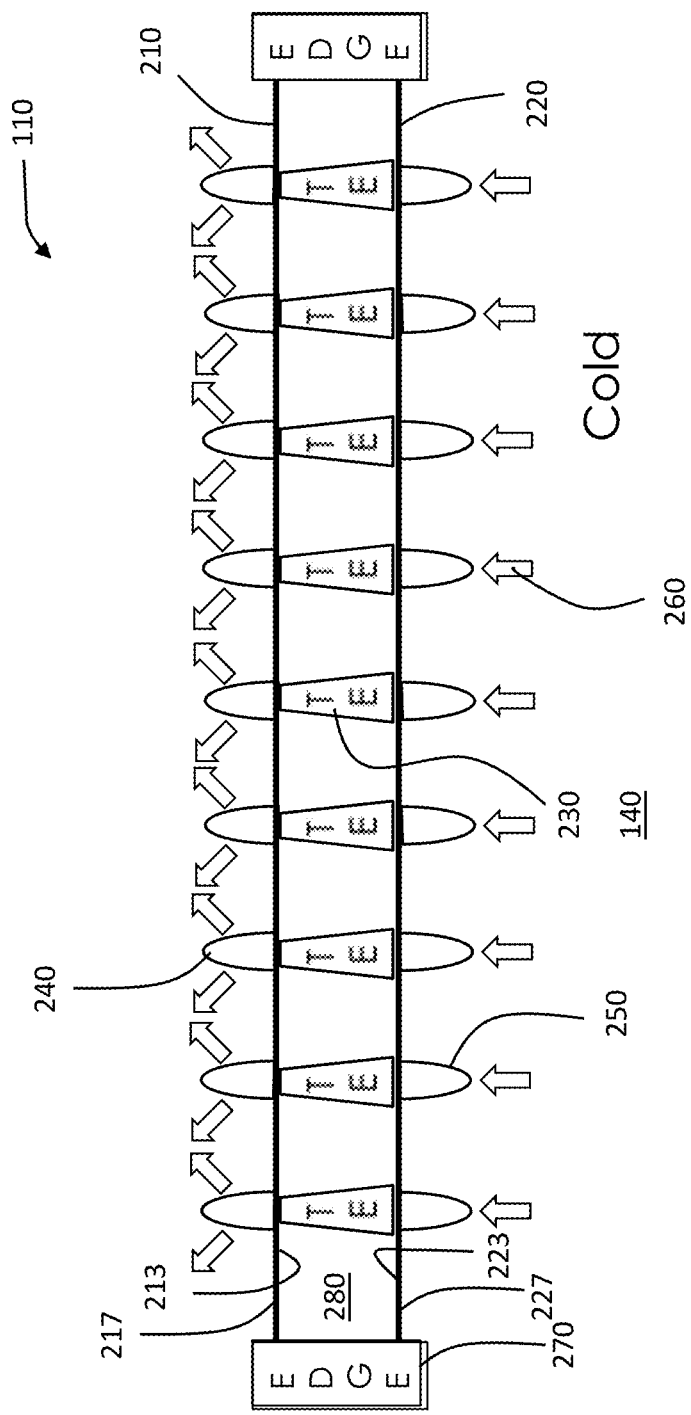
FIG. 2 is a cross-section diagram of a thermoelectric panel from FIG. 1.

FIG. 2 shows a diagram of a cross-section of one of the thermoelectric panels 110. The panel 110 includes a first layer 210 and a second layer 220. The first layer 210 has an inner surface 213 and an outer surface 217, and the second layer 220 has an inner surface 223 and an outer surface 227. Herein, the inner surfaces 213, 223 of the first layer 210 and the second layer 220 are defined as the surfaces in contact with a volume 280 formed by the first layer 210 and the second layer 220 and at least one edge structure 270. Consequently, the outer surfaces 217, 227 of the first layer 210 and the second layer 220 are not in contact with the volume 280. The layers 210, 220 may be made of a suitable material that does not permit diffusion of gases into the volume 280 and spreads heat by thermal conduction, such as, but not limited to, aluminum or thin stainless steel foil. A plurality of thermoelectric devices 230 are disposed between the first layer 210 and the second layer 220 within the volume 280. The volume 280 may be occupied by vacuum or a non-thermally conductive material. Exemplary non-thermally conducive materials for use in the volume 280 may include one or more of: air in closed non-convective cells, cells filled by silica, titania, or alumina aerogels or with polymer aerogels.

A plurality of cooling structures 240 may be disposed on the outer surface of the first layer 210. Optionally, a plurality of heat absorbing structures 250 may be disposed on the outer surface of the second layer 220. The heat absorbing structures 250 may be of the same or different shape as the outer surface and may include hydrophobic coatings to avoid dew drops and condensates at the surface. The flow of heat into the second layer 220 and out of the first layer 210 are shown by arrows 260. The edge structures 270 enclose the ends of the first layer 210 and the second layer 220 and preserve the vacuum with in volume 280. While the first layer 210 and the second layer 220 are shown in a side view, they are three-dimensional, and the edge structures 270 may surround the layers 210, 220 around their respective edges in order to seal the volume 280 from ambient.

In operation, power is applied from the power source 180 to the panels 110. The thermoelectric devices 230 in the panels 110 produce a temperature differential. The heat 260 is drawn of the second layer 220 and transmitted to the first layer 210, where it is released into the ambient environment, either directly or by way of the cooling structures 240. In some embodiments, heat 260 may follow a pathway to the second layer 220 through a set of heat removal structures 250 on the outer surface 227 of the second layer 220. The vacuum is in the volume 280 is maintained by the layers 210, 220 and the edge structures 270. Heat leakage from the ambient environment back across the panels 110 is reduced or prevented by the vacuum or insulation within the volume 280.

Figure 3:
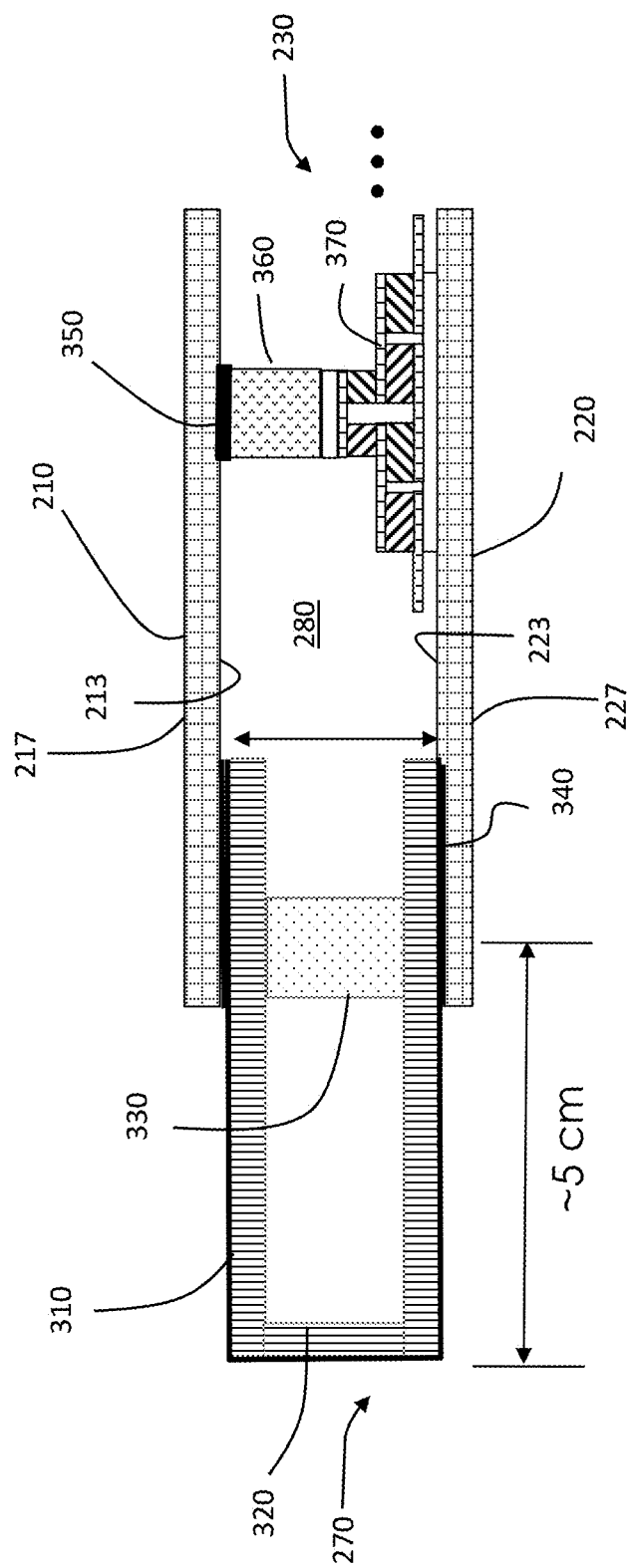
FIG. 3 is a diagram showing a close-up of the edge structure and thermoelectric device of the thermoelectric panel of FIG. 2.

FIG. 3 shows a side view diagram of an edge structure 280 adjacent to one of the thermoelectric devices 230. The edge structure 280 may include a gas diffusion resistant layer 310 and an edge housing 320. The gas diffusion resistant layer 310 may surround the edge housing 320 to prevent air or water vapor from penetrating the edge structure 280, while the edge housing 320 provides strength to maintain the shape of the edge structure 280. The edge housing 320 may be dimensioned to be fitted between the first layer 210 and the second layer 220. In some embodiments, the first layer 210 and the second layer 220 may be parallel and separated by a distance of about 0.5 centimeters to about 10.0 centimeters. In some embodiments, the edge housing 320 may extend beyond the ends of the first layer 210 and the second layer 220. In some embodiments, the edge housing 320 may not extend beyond the ends of the first layer 210 and the second layer 220. In some embodiments, the extension of the edge housing 320 outside of the first layer 210 and the second layer 220 may be about 5 centimeters. An exemplary gas diffusion resistant layer 310 may be a metal foil, such as a stainless steel foil. The foil is sufficiently thick to endure handling without compromising the gas diffusion resistance or air-tightness. In some embodiments, the gas diffusion resistant layer 310 may be about 10 micrometers thick. The edge housing 320 may be made of a material with low thermal conductance and sufficient strength to maintain the distance between the first layer 210 and the second layer 220. The edge housing 320 may be made of a thermoset plastic laminate glass epoxy with a grade of FR4, polyurethane, HDPE, or Airloy as defined by NEMA LI 1-1998, or better.

The edge structure 270 may also include one or more pillars 330 supporting the edge housing 320. The pillars 330 may be made of a material with a high strength to mass ratio and low thermal conductivity. In some embodiments, the pillars may be made of an aerogel, such as Airloy. In some embodiments, the pillars 330 may be about 2 to 3 millimeters in diameter each. The edge housing 320 may be inserted between the first layer 210 and the second layer 220 and joined with a vacuum epoxy layer 340 to prevent an exchange of atmosphere or gases with the volume 280. In some embodiments, the vacuum epoxy layer 340 may be made of an epoxy formulated to meet NASA ASTM E595 low outgassing standards, such as 3M Scotch Weld and Thorlab's Vacuum Epoxy.

The thermoelectric device 230 may include a heat conductive spacer 360 and a thermoelectric converter unit 370. The heat conductive spacer 360 is sized so that the thermoelectric device 230 makes thermal contact with the inner surfaces of both the first layer 210 and the second layer 220. The heat conductive spacer 360 may be made of any suitable thermally conductive material with a compressive yield strength that is the same or greater than the compressive yield strength of the thermoelectric converter unit 370. In some embodiments, the heat conductive spacer 360 is metal. In some embodiments, the heat conductive spacer 360 is copper. A layer of thermal interface material 350 may be disposed between the heat conductive spacer 360 and the first layer 210 to improve thermal conduction between the heat conductive spacer 360 and the first layer 210. The thermal interface material 350 may include a silicone oil. In some embodiments, the thermal interface material 350 may include a silicone oil with embedded nanoparticles of silver or boron nitride.

FIG. 4 shows a schematic of a two-stage thermoelectric converter cell 370 for producing a temperature differential when electrically energized. The thermoelectric converter cell 370 includes a pair of thermally conducting electrically insulating (TCEI) substrate layers 410 (upper 413 and lower 417). Between the substrate layers 410 are a plurality of n-type thermoelements 420 and a plurality of p-type thermoelements 430. Separating the thermoelements 420, 430 from each other and the substrate layers 410 are sets of metal links 440. In some embodiments, the metal links 440 alternate with the thermoelements 420, 430 and the substrate layers 410 in the direction from the hot side layer 417 to the cold side layer 413 of the thermoelectric converter cell 370. The n-type thermoelements 420 and the p-type thermoelements 430 alternate from the positive side to the negative side of the thermoelectric converter 370 and from the hot side layer 417 to the cold side layer 413. For reference, in all embodiments discussed in this disclosure, stages of thermoelements 420, 430 begin with the first stage that is closest to the hot side layer 417 and increase in ordinal numbering in the direction of the cold side layer 413. A plurality of thermoelectric converter cells 370 may be replicated between the substrate layers 410 from the positive end to the negative end of the thermoelectric panel 110. The cells 370 may be electrically connected to adjacent cells 370 through one or more of the metal links 440.

The n-type thermoelements 420 may be made of, but are not limited to, alloys of Bismuth Telluride and Bismuth Selenide such as $Bi_2Te_{2.7}Se_{0.3}$, P-doped SiGe, $YbAl_3$, P-doped Si and SiGe nanowires, rare earth tellurides such as $La_3Te_4$ and $Pr_3Te_4$, skutterudites such as Ba—Yb—$CoSb_3$, chacogenides such as Pb—Sb—Ag—Te, Pb—Te—Se, and Mg—Ag—Sb, and half-Heusler alloys such as Hf—Zr—Ni—Sn—Sb. The p-type thermoelements 430 may be made of, but are not limited to, alloys of Bismuth Telluride and Antimony Telluride such as $Bi_{0.5}Sb_{1.5}Te_3$, B-doped SiGe, B-doped Si and SiGe nanowires, $Zn_4Sb_3$, skutterudites such as $CeFe_{3.5}Co_{0.5}Sb_{12}$, Zintl compounds such as $Yb_{14}MnSb_{11}$, rare earth tellurides such as $Ce_3Te_4$, $MnSi_{1.73}$, SnSe, PbS-bAgSnTe, $CePd_3$, $NaCo_2O_4$, half-Heusler alloys such as Nb—Ti—Fe—Sb—Sn. In some embodiments, the n-type and p-type thermoelements 420, 430 may include different ratios of Bismuth Telluride, Antimony Telluride, and Bismuth Selenium ($Bi_2Te_3$:$Sb_2Te_3$:$Bi_2Se_3$) in the ratio of, for example, 1:3:0 or 10:0:1). In some embodiments, a p-type thermoelement 430 may include Bismuth Antimony Telluride alloy ($Bi_{2-x}Sb_xTe_3$) and an n-type thermoelement 420 may include a Bismuth Tellurium Selenide alloy ($Bi_2Te_{3-y}Se_y$), where x and y vary between about 1.4-1.6 and about 0.1-0.3 respectively. The substrate layer 410 may include one of: a ceramic, an insulator and metal combination, and an insulator and semiconductor combination. Suitable ceramics may include, but are not limited to, one or more of: alumina $Al_2O_3$, aluminum nitride (AlN), berylium oxide (BeO), boron nitride (BN), diamond (C), silicon nitride (SiN), and sapphire (SiC). Suitable insulator and metal combinations may include, but are not limited to, an insulator made of one of: polymide, parylene, anodized aluminum, anodized molybdenum, CVD alumina, plated ceramics, and parylene or polymide-coated anodized alumina combined with a metal made of one of: aluminum, copper, nickel, molybdenum, molybdenum-copper alloy, tungsten-copper alloy, and copper-aluminum composite. In some embodiments, the insulator layer may have a thickness of less than 10 micrometers. Suitable insulator and semiconductor combinations may include, but are not limited to, an insulator made of one of: thermal silicon oxide, CVD silicon oxide, and silicon nitride (SiN) combined with a semiconductor made of one of: silicon and silicon carbide (SiC). The selection of a substrate layer material may impact performance and reliability of the thermoelectric converter cell 370 due to heat expansion coefficients of the materials used. The metal links 440 may be made of one of: copper, a copper or nickel layer with nickel/gold coating, a copper or nickel layer with platinum/gold alloy, gold, or silver.

The p-type thermoelements 430 include thermoelement 433, thermoelement 435, and thermoelement 437, each of which have different electrical resistance. In some embodiments, the different electrical resistances are achieved by the thermoelements 433, 435, 437 having different cross-sectional areas (which appears a difference in width in the side view). As shown, the cross-sectional area of the thermoelement 433 is greater than the cross-sectional area of the thermoelement 435. The cross-sectional area of thermoelement 437 is less than the cross-sectional area of either thermoelements 433 and 435. Likewise, the n-type thermoelements 420 include thermoelement 423, thermoelement 425, and thermoelement 427, each of which have different electrical resistance. In some embodiments, the different electrical resistances are achieved by the thermoelements 423, 425, 427 having different cross-sectional area (which appears a difference in width in the side view). The cross-sectional area of the thermoelement 423 is greater than the cross-sectional area of the thermoelement 425. The cross-sectional area of thermoelement 427 is less than the cross-sectional area of either thermoelements 423 and 425. The different cross-sectional areas of the thermoelements 423, 425, 427, 433, 435, 437 correspond to the different resistances, and, thus, amounts of electrical currents passing through the respective elements. The thermoelements 423, 433 may be sized larger for higher COPs and $\Delta T_{max}$. Also, the ratio of cross-sections of p-type elements 425, 427 and n-type elements 435, 437 may be changed to increase or decrease the COPs and $\Delta T_{max}$. In some embodiments, the different resistances in thermoelements 423, 425, 427, 433, 435, 437 may be achieved by varying the thicknesses of the thermoelements 423, 425, 427, 433, 435, 437 as would be understood by a person of skill in the art.

FIGS. 5A-5C show a top view of stages of assembly of the thermoelectric converter unit 370 during fabrication. FIG. 5A shows a first stage with the thermoelements 423, 425, 433, 435 disposed on metal links 440. FIG. 5B shows a second stage with the metal links 440 now covering the first stage thermoelements 423, 425, 433, 435. The second stage thermoelements 427, 437 are disposed on the metal links 440 of the second stage. FIG. 5C shows a substrate layer 413 disposed on top of the thermoelements 427, 437. While not visible in FIG. 5C, but shown in FIG. 4, there is a metal plate 440 disposed between the second stage thermoelements 427, 437 and the top substrate 413 to provide electrical communication between the second stage thermoelements 427, 437.

FIGS. 6A-6E show a top view of an alternative set of stages of assembly for the thermoelectric converter unit 370 during fabrication. FIG. 6A shows a set of metal links 440 making up a bottom layer. FIG. 6B shows the first stage thermoelements 423, 425, 433, 435 disposed on the metal links 440. FIG. 6C shows a cover layer of the metal links 440 providing electrical communication paths for the first stage thermoelements 423, 425, 433, 435. FIG. 6D shows the second stage thermoelements 427, 437 disposed on the metal links 440 from FIG. 6C. FIG. 6E shows a substrate layer 413 disposed on top of the thermoelements 427, 437. While not visible in FIG. 6E, but shown in FIG. 4, there is a metal plate 440 disposed between the second stage thermoelements 427, 437 and the top substrate 413 to provide electrical communication between the second stage thermoelements 427, 437.

Figure 7B:
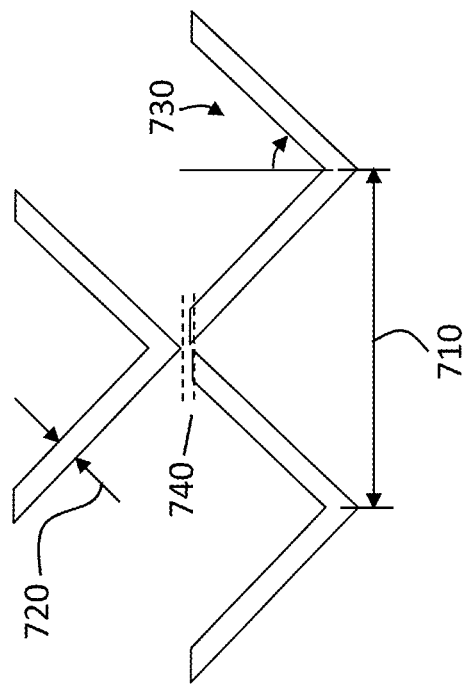
FIG. 7B is a top view diagram of individual chevron-shaped cooling fins of the cooling structures from FIG. 7A.
Figure 7A:
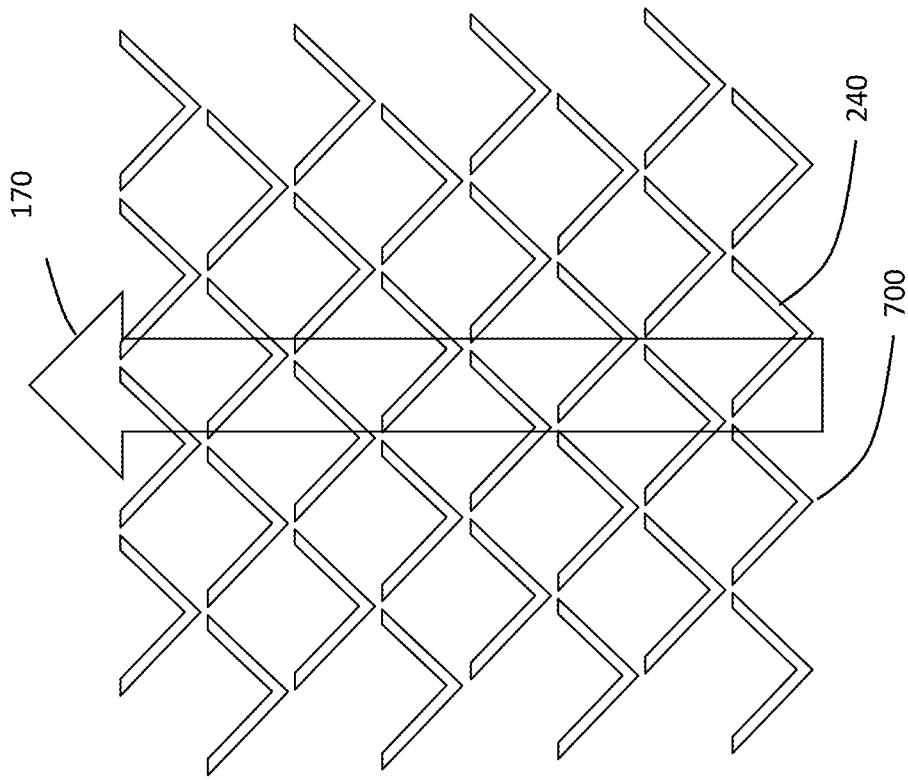
FIG. 7A is a top view diagram of the cooling structures of the thermoelectric panel from FIG. 2 according to one embodiment of the present disclosure.

FIG. 7A shows a top view diagram of the plurality of cooling structures 240 disposed on the outer surface of the top layer 210 to enhance heat transfer due to natural convection of ambient air. The cooling structures 240 include individual fins 700 that are raised from the surface of the top layer 210 to extend into the ambient air. The fins 700 may be made of a thermally conductive material, such as aluminum or graphite. Other suitable materials for the fins 700 may include, but are not limited to, copper, silicon, aluminum nitrides, and diamond. The arrow 170 shows the flow path of air over and among the fins 700.

FIG. 7B shows a diagram of a subset of the fins 700 from FIG. 7A. Each fin 700 has a distance between the midpoint of the fins 710, a thickness 720, and a bisection angle 730. In some embodiments, the distance 710 is about 25 millimeters. The fins 700 may be separates vertically by a gap 740. In some embodiments, the gap 740 may be smaller than the thickness 720; however, this is exemplary and illustrative only. In some embodiments, the distance 710 may range from about 10 millimeters to about 40 millimeters. In some embodiments, the thickness 720 is about 1 millimeter. In some embodiments, the thickness 720 may range from about 0.1 millimeters to about 3.0 millimeters. In some embodiments, the bisection angle 730 is about 45 degrees. In some embodiments, the bisection angle 730 may range from about 30 degrees to about 60 degrees. The fins 700 may be disposed on the outer surface of the first layer 210 in arrays. Each array may a plurality of fins 700. In some embodiments, the array of fins 700 is 16 by 16. In some embodiments, the fins 700 are about 12.5 millimeters in height. In some embodiments, the height of the fins 700 may range from about 10 millimeters to about 20 millimeters.

In operation, the air flow path 170 moves parallel to the surface of the first layer 210 gathering heat conducting or radiating from the surface of the first layer 210. When the air flow path 170 intersects a fin 700, the warmer air is redirected away from the first layer 210, thus removing heat. Cooler air then replaces the warmer air in the air flow 170 path to both cool the first layer 210 and to remove more heat.

Figure 8:
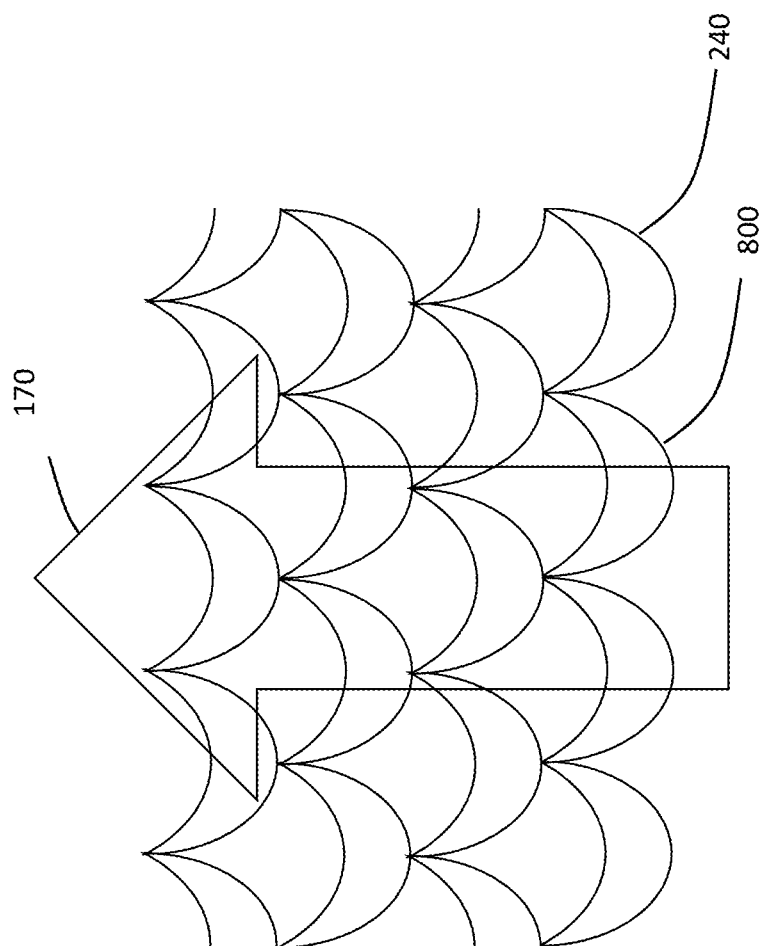
FIG. 8 is a top view diagram of dune-shaped cooling structures of the thermoelectric panel from FIG. 2 according to another embodiment of the present disclosure.

FIG. 8 shows a top view diagram of the plurality of cooling structures 240, where the cooling structures 240 include individual dunes 800. Similar to the description of FIGS. 7A-7B, the dunes 800 are raised and project out from the outer surface of the first layer 210 to redirect the air flow path 170 and remove heat from the first layer 210. The dunes 800 may have uniform dimensions and be spaced about 25 millimeters apart (midpoint to midpoint). The range of heights of the dunes 800 may be similar to the range of heights of the fins 700. Unlike the chevron-shaped fins 700, the thickness of the dunes 800 changes along its length from side to side.

Figure 9A:
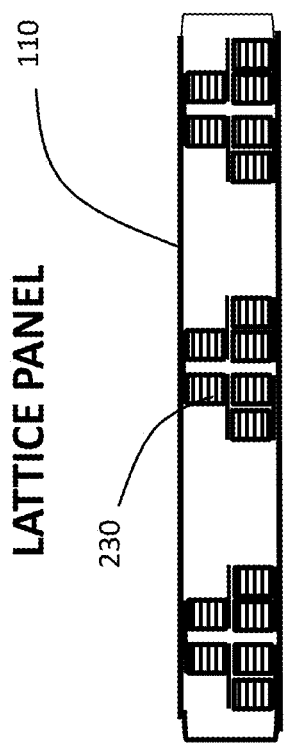
FIG. 9A is a cross-section diagram of a thermoelectric panel according to another embodiment of the present disclosure.
Figure 9C:
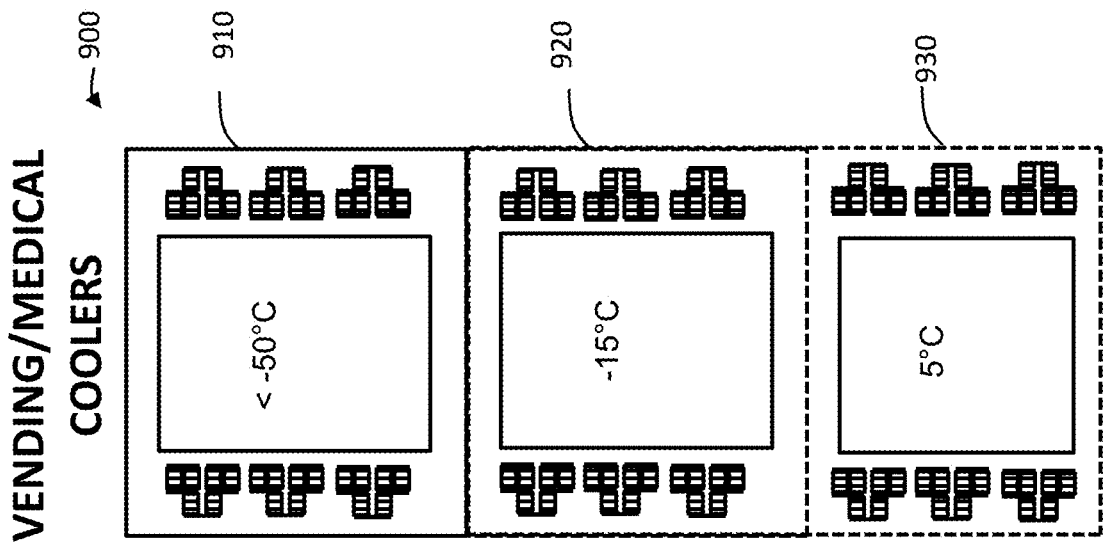
FIG. 9C is a cross-section diagram of a multi-level cooling device using the thermoelectric panels for FIG. 9B according to one embodiment of the present disclosure.
Figure 9B:
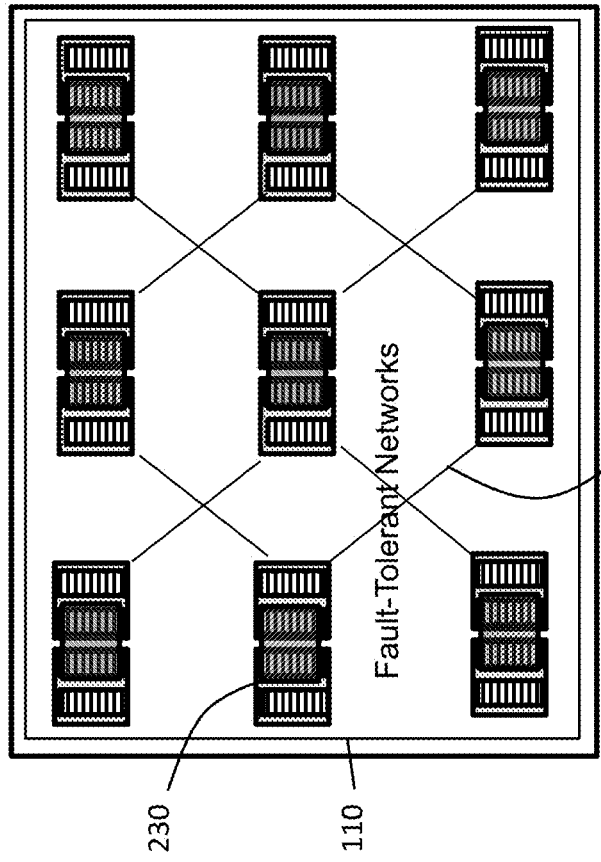
FIG. 9B is a top view diagram of the thermoelectric panel of FIG. 9A.

FIGS. 9A-9C show an apparatus 900 employing multiple thermoelectric panels 110 to provide multiple levels of cooling. FIG. 9A shows a side view diagram of the thermoelectric panel 110. FIG. 9B shows a top diagram of the thermoelectric panel 110. The thermoelectric devices 230 may be interconnected by wires 905 to form a fault tolerant electrical network as would be understood by one ordinary skill in the art. The fault tolerant network enables cooling to continue even is one or more of the individual thermoelectric devices 230 becomes nonoperational by providing redundant paths or percolating networks. FIG. 9C shows the apparatus 900 with multiple thermoelectric panels 110 arranged in multiple levels. By regulating the types of thermoelements, power delivered to the panels 110, and/or adjusting the duty cycle of the panels 110, different temperature zones may be maintained. The first zone 910 may be maintained at very cold temperatures (less than −50 degrees Celsius), such as for a deep freezer. The second zone 920 may be maintained at moderately cold temperatures (around −15 degrees Celsius) suitable for a freezer. The third zone 930 may be maintained at refrigerator temperatures (around 5 degrees Celsius) suitable for a household refrigerator. Since each panel may be independently controlled and heat is being extracted by each thermoelectric device 230, the cooling will be very even within the apparatus 900. Thus, warm and cold spots found in typical refrigeration and freezer devices can be eliminated. In some embodiments, different panels 110 may be active and inactive or receive varied amounts of power to create a temperature differential within one of the zones 910, 920, 930.

Figures 10A, 10B:
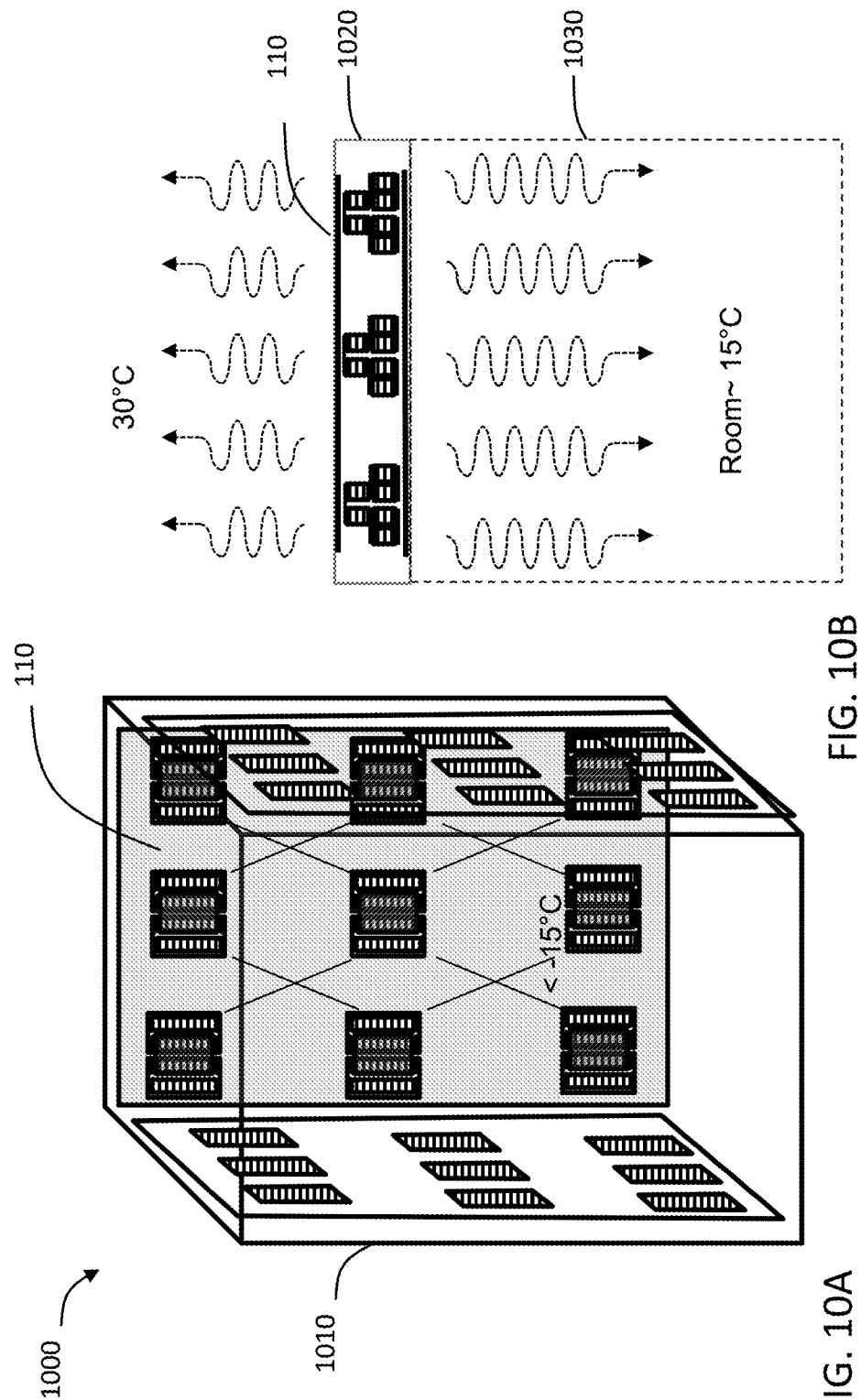
FIG. 10A is a three-dimensional diagram showing a cooling container using an arrangement of thermoelectric panels according to one embodiment of the present disclosure.
FIG. 10B is a cross-section diagram showing a thermoelectric panel as a ceiling tile according to one embodiment of the present disclosure.

FIG. 10A shows a three-dimensional diagram of an apparatus 1000 for use as a cooling transportation container. The apparatus 1000 include a plurality of thermoelectric panels 110 within a frame 1010. The frame 1010 provides attachment or insertion points for the panels 110 to from a cubic or rectangular transportation container. In some embodiments, the frame 1010 is flexible allowing the panels 110 to be folded together, such that the apparatus 1000 may be collapsed to for convenient storage.

FIG. 10B shows a diagram of a side view of a building tile 1020. The building tile encloses a thermoelectric panel 110. The thermoelectric panel 110 may be in electrical communication with an electrical power source (not shown). The building tile 1020 may be installed as a ceiling tile above a room 1030. When activated, the panel 110 may provide cooling to the room 1030 by transferring heat outside of the room 1030. As would be understood by a person of ordinary skill in the art, this configuration may be reversed (either physically or by reconfiguring the power) to provide heat in the room 1030. In some embodiments, the building tile 1020 may be disposed in the floor to heat the floor surface or in the walls to heat the room 1030.

Figure 11:
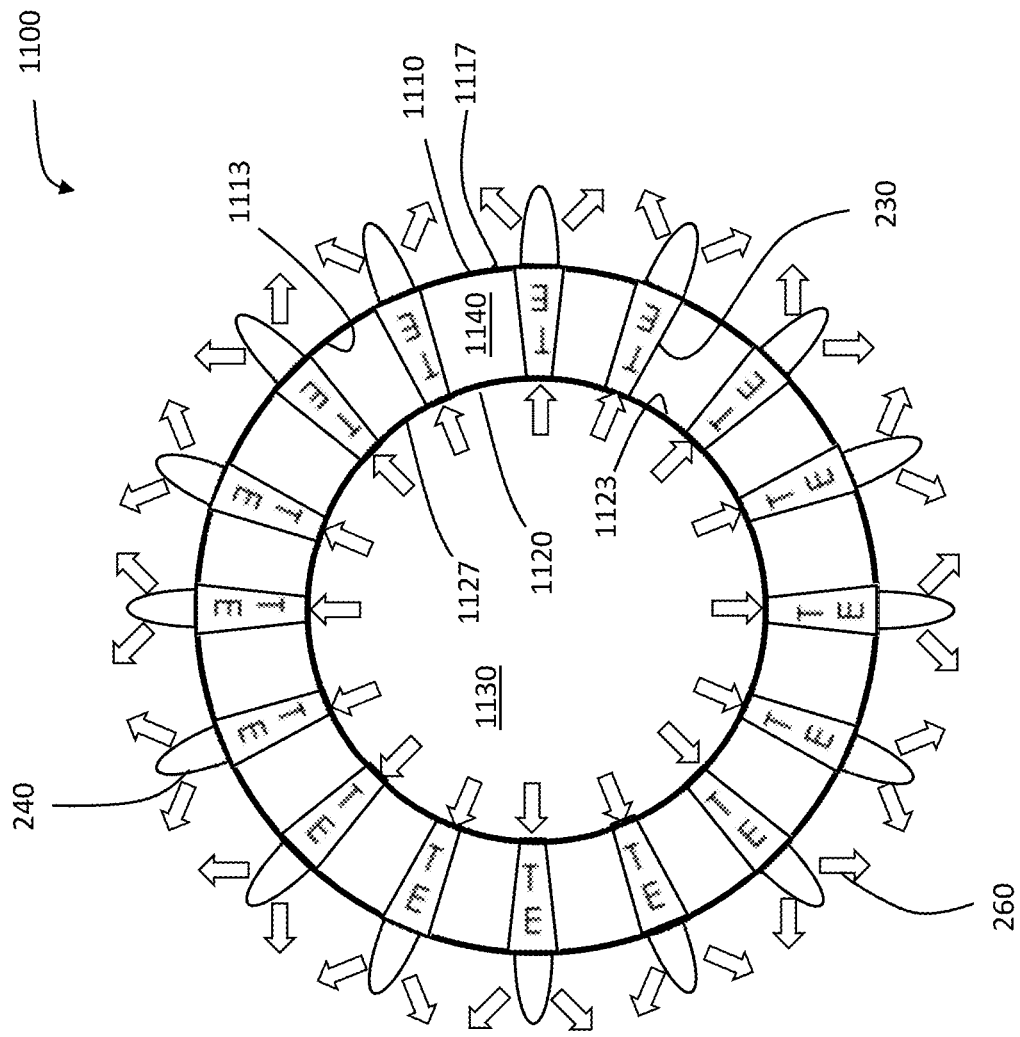
FIG. 11 is a cross-section diagram of a thermoelectric cooling apparatus with curved thermoelectric panels according to another embodiment of the present disclosure.

FIG. 11 shows a side diagram of a two-dimensional representation of a cylindrical or spherical thermal apparatus 1100. The apparatus includes a first curved layer 1110 and a second curved layer 1120. The thermoelectric devices 230 may be disposed between and in thermal communication with the inner surfaces 1113, 1123 of the first curved layer 1110 and the second curved layer 1120. The second curved layer 1120 encloses a volume 1130, which may be used as a refrigeration chamber or a heating chamber depending on the configuration of the thermoelectric devices 230. The first curved layer 1110 and the second curved layer 1120 also form a volume 1140 that insulates the volume 1130 from the ambient environment. The volume 1140 may include a vacuum, a thermal insulation based on aerogels, or a combination thereof. In some embodiments, one or more cooling structures 240 may be disposed on an outer surface 1117 of the first layer 1110. Though not shown, the apparatus 1100 may include one or more power supplies for the thermoelectric elements 230, as well as, a resealable opening to provide ingress and egress for contents to be placed in or removed from the volume 1130, as would be understood by a person of ordinary skill in the art. Edge structures 270 may be disposed along the ends of the layers 1110, 1120 at any openings to the volume 1130 so preserve the integrity of the volume 1140.

In operation, electrical power supplied to the thermoelectric devices 230 causes a temperature differential between the first layer 1110 and the second layer 1120. In the case of refrigeration, the cold outer surface 1127 of the second layer 1120 removes heat 260 from the volume 1130. The heat 260 is transmitted to the first layer 1110, where it may be removed to ambient, either through direct convection or through transmission to the cooling structures 240. Heat leakage back into the volume 1130 from ambient is reduced or prevented by the low thermal conductivity of the volume 1140 either by the presence of a vacuum or the thermal insulation.

Figure 12:
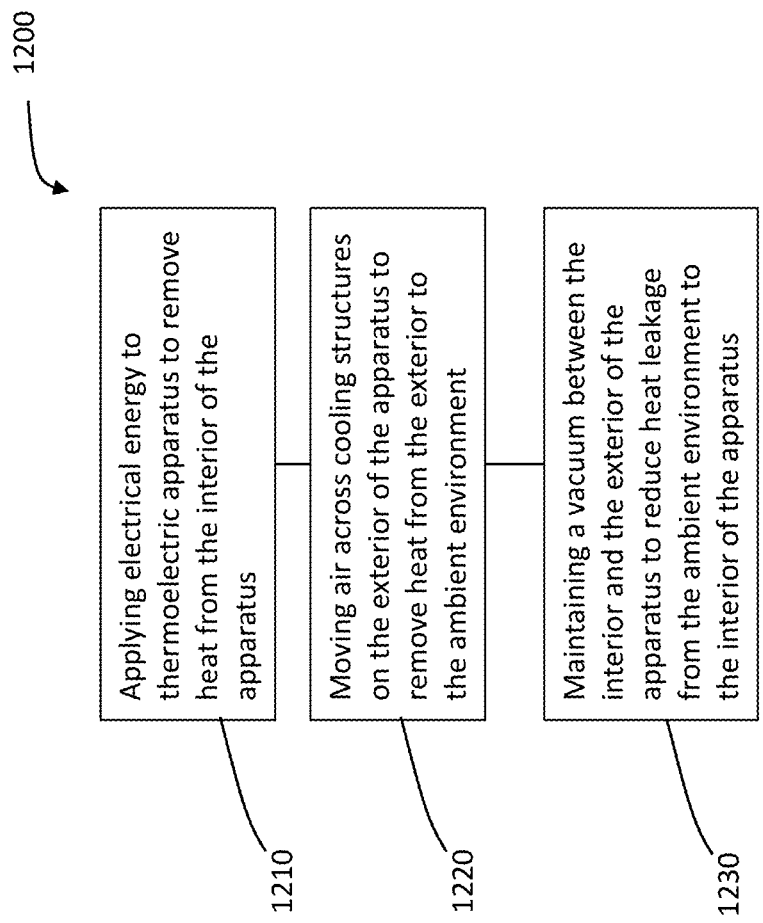
FIG. 12 is a flowchart of a method for cooling according to one embodiment of the present disclosure.

FIG. 12 shows a flowchart of a method 1200 that may be use with the apparatuses 100, 900, 1000, 1100. In step 1210, electrical energy from the power source 180 may be applied to the apparatus 100, 900, 1000, 1100 to energize the thermoelectric devices 230 and generate a temperature differential to remove heat from the interior of the apparatus 100, 900, 1000, 1100 to its exterior (i.e. the outer surface 217, 1117). In step 1220, air may be moved over the cooling structures 240, if present, to remove heat from the outer surface 217, 1117 and enhance the cooling effect. In step 1230, a vacuum is maintained between the first layer 210, 1110 and the second layer 220, 1120 to reduce or prevent heat leakage from the ambient environment into the interior 140, 1130 of the apparatus 100, 1100. Steps 1210, 1220, and 1230 may be performed in parallel. As would be understood by a person of ordinary skill in the art, the method 1200 may be used with a modified device to heat the interior of the apparatus 100, 900, 1000, 1100 for heating applications as well.

While the disclosure has been described with reference to exemplary embodiments, it will be understood that various changes may be made and equivalents may be substituted for elements thereof without departing from the scope of the disclosure. In addition, many modifications will be appreciated to adapt a particular instrument, situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A thermoelectric apparatus, the apparatus comprising:
    a plurality of thermoelectric panels, each of the thermoelectric panels comprising:
        a first layer having an inner side and an outer side, wherein the first layer is thermally conductive;
        a plurality of thermoelectric devices disposed on the inner side of the first layer;
        a second layer having an inner side and an outer side, wherein the second layer is thermally conductive, and wherein the plurality of thermoelectric devices is disposed on the inner side of the second layer;
        a plurality of edge structures connected to the first layer and the second layer to form a volume between the first layer, the second layer, and the plurality of edge structures, wherein each of the edge structures comprises:
            a u-shaped housing of thermal insulation;
            a gas diffusion resistant layer disposed on the u-shaped housing; and
            a plurality of thermally non-conductive pillars disposed within the u-shaped housing between parallel sides of the u-shaped housing;
    an insulated bottom supporting the plurality of thermoelectric panels; and
    an insulated top supported by the plurality of thermoelectric panels;
    wherein the plurality of thermoelectric panels and the plurality of edge structures form a closed system.

2. The thermoelectric apparatus of claim 1, wherein the thermoelectric device comprises:
    a first substrate layer;
    a first set of metal links disposed on one side of the first substrate layer;
    a first stage of thermoelements disposed on and in electrical and thermal communication with the first set of metal links and comprising:
        a first plurality of n-type thermoelements; and
        a first plurality of p-type thermoelements alternating with the first plurality of n-type thermoelements;
    a second stage of thermoelements disposed on and in electrical and thermal communication with the first stage of thermoelements and comprising:
        a second plurality of n-type thermoelements; and
        a second plurality of p-type thermoelements alternating with the second plurality of n-type thermoelements;
    a second set of metal links disposed on and in electrical and thermal communication with the second stage of thermoelements; and
    a second substrate layer disposed on the second set of metal links.

3. The apparatus of claim 2, wherein the apparatus has a front end and a back end and wherein the first stage thermoelement closest to the front end is the same type as the second stage thermoelement closest to the front end.

4. The apparatus of claim 3, wherein the first stage thermoelement closest to the back end is the same type as the second stage thermoelement closest to the back end.

5. The apparatus of claim 2, wherein the thermoelements of the second stage have greater electrical resistances than the thermoelements of the first stage.

6. The apparatus of claim 2, wherein the n-type thermoelements comprise an n-type thermoelectric material comprising at least one of: alloys of Bismuth Telluride and Bismuth Selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb.

7. The apparatus of claim 2, wherein the p-type thermoelements comprise a p-type thermoelectric material comprising at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn.

8. The apparatus of claim 2, wherein the n-type thermoelements comprise $Bi_{2-x}Sb_xTe_3$ and the p-type thermoelements comprise $Bi_2Te_{3-y}Se_y$, where x is between about 1.4 and 1.6 and y is between about 0.1 and 0.3.

9. The apparatus of claim 2, wherein the substrate layer comprises a ceramic.

10. The apparatus of claim 9, wherein the ceramic comprises at least one of: alumina $Al_2O_3$, aluminum nitride (AlN), berylium oxide (BeO), boron nitride (BN), diamond (C), silicon nitride (SiN), and sapphire (SiC).

11. The apparatus of claim 2, wherein each of the first set of metal links and the second set of metal links comprise at least one of: 1) copper, 2) copper with a coating of nickel, gold, platinum/gold alloy, or silver, 3) nickel with a coating of gold, platinum/gold alloy, or silver.

12. The apparatus of claim 2, wherein each of the n-type and p-type thermoelements comprises:
    a pair of metal layers;
    a pair of coating layers disposed between the metal layers; and
    one of an n-type and p-type thermoelectric material disposed between the pair of coating layers.

13. The apparatus of claim 12, wherein the coating layers comprise at least one of: titanium tungsten (TiW), tantalum nitride (TaN), tantalum (Ta), and nickel (Ni).

14. The thermoelectric apparatus of claim 1, wherein each of the thermoelectric devices further comprises:
    at least one thermally conductive spacer disposed between the thermoelectric unit and the inner side of at least one of the first inner layer and the second layer.

15. The thermoelectric apparatus of claim 14, wherein a thermal interface layer is disposed between the at least one thermally conductive spacer and the inner face.

16. The thermoelectric apparatus of claim 1, further comprising:
    a plurality of cooling structures disposed on the outer side of the first layer.

17. The thermoelectric apparatus of claim 1, further comprising:
    a plurality of cooling structures disposed on the outer side of the second layer.

18. The thermoelectric apparatus of claim 1, further comprising:
    an air mover positioned to direct air flow over the surface of at least one of the plurality of thermoelectric panels.

19. The thermoelectric apparatus of claim 1, wherein the first layer and the second layer prevent diffusion of gasses.

20. The thermoelectric apparatus of claim 1, further comprising:
    a thermal insulation layer disposed between and in contact with the first layer and the second layer and that does not obstruct the heat flow across the plurality of thermoelectric devices.

21. The thermoelectric apparatus of claim 20, wherein the thermal insulation layer is made of one of: a vacuum, an aerogel, and air in closed non-convective cells.

\* \* \* \* \*